United States Patent
Teterwak

(10) Patent No.: US 7,535,389 B1
(45) Date of Patent: May 19, 2009

(54) SYSTEM AND METHOD FOR IMPROVING THE DYNAMIC PERFORMANCE OF A DIGITAL-TO-ANALOG CONVERTER (DAC)

(75) Inventor: Jerzy Antoni Teterwak, Colorado Springs, CO (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 11/941,865

(22) Filed: Nov. 16, 2007

(51) Int. Cl.
*H03M 1/10* (2006.01)
(52) U.S. Cl. ...................... 341/118; 341/144
(58) Field of Classification Search .............. 341/118, 341/120, 144, 145
See application file for complete search history.

(56) References Cited

U.S. PATENT DOCUMENTS 5,594,443 A * 1/1997 Lam ........................... 341/144

2008/0238747 A1* 10/2008 Moore et al. ............... 341/144

FOREIGN PATENT DOCUMENTS

| JP | 02054624 A | * | 2/1990 |
| JP | 05022135 A | * | 1/1993 |

* cited by examiner

*Primary Examiner*—Howard Williams
(74) *Attorney, Agent, or Firm*—Fountain Law Group, Inc; George L. Fountain

(57) ABSTRACT

An apparatus and method for reducing distortion from an output of a digital-to-analog converter (DAC). In one implementation, the distortion being reduced is third order harmonic distortion caused by charge transfer effects and instantaneous output impedance drop during switching. Each of the embodiments includes a module adapted to generate a distortion correction signal being a function of the input digital signal, the full scale code of the DAC, the load resistance, the conversion rate of the DAC, and a proportionality constant. In another implementation, the distortion being reduced is higher order harmonic distortion caused by timing skew between a main DAC and a least significant bit (LSB) DAC. Each of the embodiments includes a module adapted to generate a distortion correction signal being a function of the input digital signal, the number of levels covered by the LSB DAC, the conversion rate of the DAC, and the timing skew.

33 Claims, 10 Drawing Sheets

US 7,535,389 B1

SYSTEM AND METHOD FOR IMPROVING THE DYNAMIC PERFORMANCE OF A DIGITAL-TO-ANALOG CONVERTER (DAC)

FIELD OF THE INVENTION

This invention relates generally to digital-to-analog converters, and in particular, to a system and method of improving the dynamic performance of a digital-to-analog converter.

BACKGROUND OF THE INVENTION

Current-steering digital-to-analog converters (DACs), especially those implemented using metal oxide semiconductor (MOS) technology, are useful in converting digital signals into analog signals at a relatively high rate. Current-steering DACs are also configured to generate a differential output in order to better reduce noise, increase its output power, and suppress even order harmonics. Although current-steering DACs are useful and generally provide acceptable performance, they also suffer from being susceptible to third order harmonic distortion and higher order distortions, as explained with reference to the following examples.

FIG. 1 illustrates a schematic diagram of an exemplary current-steering DAC 100. The current-steering DAC 100 typically comprises a plurality of current-steering segments 102-1 through 102-N. Each current-steering segment is adapted to direct current to either the positive output terminal (OUTP) or the negative output terminal (OUTN) based on a complementary control signal, such as D1 and DB1 for segment 102-1 and Dn and DBn for segment 102-N. A binary-to-thermometer code decoder is typically employed to generate the complementary control signal from an input digital signal, which the DAC 100 converts into an output analog signal.

Each current-steering segment (e.g., 102-1 and 102-N) comprises a first transistor (e.g., M1 and M5), a second transistor (e.g., M2 and M6), and a pair of differential transistors (e.g., M3/M4 and M7/M8). The source of the first transistor (e.g., M1 and M5) is coupled to a power supply voltage (AVDD). The drain of the first transistor (e.g., M1 and M5) is coupled to the source of the second transistor (e.g., M2 and M6). The drain of the second transistor (e.g., M2 and M6) is coupled to the sources of the differential transistor pair (e.g., M3/M4 and M7/M8). The positive output terminal (OUTP) of the current-steering DAC 100 is taken off the drain of one of the differential transistor pair (e.g., M3 and M7, the transistors driven by complementary signal D1 and Dn). The negative output terminal (OUTN) of the current-steering DAC 100 is taken off the drain of the other differential transistor pair (e.g., M4 and M8, the transistors driven by complementary signal DB1 and DBn).

The first transistor (e.g., M1 and M5) of each current-steering segment (e.g., 102-1 and 102-N) serves to the set the amount of current flow through the segment in response to a VGATE control signal applied to its gate. The second transistor (e.g., M2 and M6) serves as a cascode device to set the steady-state output impedance of each segment in response to a VCASC control signal applied to its gate. The differential transistor pair (e.g., M3/M4 and M7/M8) serve to steer the segment current to either the positive output terminal (OUTP) or the negative output terminal (OUTN) in response to the complementary control signal (e.g., D1/DB1 and Dn/DBn). The node corresponding to the drain of the second transistor (or sources of the differential transistor pair) is typically referred to as the summing node (e.g., nodes S1 and Sn).

The current-steering DAC 100 is susceptible to third order harmonic distortion as the result of the switching of the differential transistor pair. In particular, prior to a switching event, the positive output terminal (OUTP) may have a voltage different, and possibly substantially different, than the voltage on the negative output terminal (OUTN). During a switching event, the voltage on the summing node will change due to a finite output impedance of the transistors in the differential pair (e.g. M3/M4 and M7/M8). Because of the voltage change on the summing node, a charge transfer effect takes place which is further increased by the capacitance present at the summing node. The charge flowing to the capacitance affects the converter's output signal by creating or increasing third order harmonic distortion.

Additionally, during switching of one or more current-steering segments, the output impedance of the current-steering DAC 100 drops substantially for the instantaneous time associated with the switching. For instance, the output impedance of the segment during switching, measured differentially, is equal to 2/gds, where gds is the output conductance of transistors M3 and M4. This impedance is much lower than that of the fully switched differential transistor pair. For instance, the steady-state output impedance of the segment is determined by the cascode connection of the transistors in the segment, which is substantially higher than the output impedance during switching. This also affects the converter's output signal by creating or increasing third order harmonic distortion at the output of the DAC 100. Other distortions may further be caused by interaction of the DAC 100 with other components, such as DACs configured to generate higher resolution outputs in combination with a main DAC. This is better explained with reference to the following example.

FIG. 2 illustrates a block and schematic diagram of another exemplary DAC circuit 200. The DAC circuit 200 comprises a main current-steering DAC 202, a first least significant bit (LSB) current-steering DAC 204, and a second LSB current-steering DAC 206. The input digital signal applied to the DAC circuit 200 has a code length of M+N+K bits, where M represents the number of most significant bits (MSB), N represents the number of intermediate significant bits, and K represents the number of least significant bits (LSB). The main current-steering DAC 202 receives the most significant bits M of the input digital word. The first LSB current-steering DAC 204 receives the intermediate significant bits N of the input digital word. The second LSB current-steering DAC 206 receives the least significant bits K of the input digital word.

The main current-steering DAC 202 has $2^{M-1}$ current-steering segments and a full-scale output related to the full-scale code A of the input digital word. The first LSB current-steering DAC 204 has $2^{N-1}$ current-steering segments and a full-scale output related to the full-scale code A of the input digital word divided by 2M (i.e., $\sim A/2^M$). The second LSB current-steering DAC 206 has K binary weighted current-steering segments and a full-scale output related to the full-scale code A of the input digital word divided by $2^{(M+N)}$ (i.e., $\sim A/2^{M+N}$). The positive output terminals (OUTP) of the DACs 202, 204, and 206 are coupled together. The negative output terminals (OUTN) of the DACs 202, 204, and 206 are coupled together.

In theory, the DACs 202, 204, 206 should be clocked at substantially the same time so that the currents from each of them timely combine at the output of the DAC circuit 200. However, in practice, there are typically clock timing difference and different length propagation paths at the input and outputs of the DACs that produce timing skew between the DACs. As a result, the timing skew produces a rich spectrum of high order harmonics, which rapidly increases as the DAC clock rate increases. The distortion caused by the timing skew may limit the DAC's signal to noise and distortion ratio (SNDR), and at higher update rates and lower output signal input amplitudes it may also limit the DAC's spurious free dynamic range (SFDR).

SUMMARY OF THE INVENTION

An aspect of the invention relates to an apparatus and method of reducing third order harmonic distortion from an output analog signal of a digital-to-analog converter (DAC). The third order harmonic distortion may be due to switching of one or more current-steering segments of the DAC. In particular, the third order harmonic distortion may be caused by charge transfer effects at the summing node of each current-steering segment during switching. The third order harmonic distortion may also be caused by instantaneous drop in the output impedance of the DAC during switching of one or more current-steering segments. The apparatus and method reduces the distortion by developing a distortion correction signal from the input digital signal, and applying the distortion correction signal to the output analog signal of the DAC in one embodiment (the "analog" embodiment), and applying it to the input digital signal of the DAC in another embodiment (the "digital" embodiment).

More specifically, in the "analog" embodiment, illustrated in FIG. 3A, the DAC apparatus comprises a delay module, a distortion correction module, a sin(x)/x compensation filter, a main DAC, and a correction DAC. The distortion correction module is adapted to generate a correction sequence from at least a portion of the input digital signal to reduce the distortion from the output of the main DAC. The correction sequence may be given on the following equation:

$$d_{nc} = \beta \cdot \left(\frac{d_{n-1}}{d_{FS}} - 0.5\right) \cdot |d_n - d_{n-1}| \cdot R_L \cdot f_c$$

where $d_n$ is a nth value of the input digital signal, $d_{n-1}$ is an (n−1)th value of the input digital signal, $d_{FS}$ is the full scale code of the DAC, $R_L$ is the load resistance at the output of the DAC, $f_c$ is the conversion rate of the DAC, and $\beta$ is a constant. The sin(x)/x compensation filter performs a filter operation on the correction sequence to reduce sin(x)/x roll-off from the output analog signal of the correction DAC. The correction DAC generates the distortion correction analog signal from the distortion correction digital signal, and applies the distortion correction analog signal to the output of the main DAC. A clock circuit generates clock signals that respectively drive the main DAC and the correction DAC, but with substantially 180 degree phase difference. The 180 degree phase shift results in the output analog signal of the correction DAC being shifted by half of the sampling period T/2. The shift by half of a sampling period is desired to properly align the correction analog signal with the main DAC output analog signal. And, the delay module delays the input digital signal to the main DAC so that it is timely aligned with the distortion correction analog signal.

In the "digital" embodiment, illustrated in FIG. 4A, the DAC apparatus comprises a delay module, a distortion correction module, a T(jω) compensation filter, an adder, and a main DAC. The distortion correction module is adapted to generate a correction sequence from at least a portion of the input digital signal per the equation provided above, to reduce the distortion from the output of the main DAC. The T(jω) compensation filter performs a filter operation on the correction sequence to introduce a half of the sampling period shift and to reduce sin(x)/x roll-off from the output analog signal of the main DAC. The adder adds the distortion correction digital signal to the input digital signal delayed by the delay module. And, the main DAC generates the output analog signal from the output of the adder.

Another aspect of the invention relates to an apparatus and method of reducing higher order distortion from an output analog signal of a main DAC. The higher order harmonic distortion may be caused by timing skew between the main DAC and one or more other least significant bits (LSB) section DACs. The apparatus and method reduces the distortion by developing a distortion correction signal from at least a portion of the input digital signal, and applying the distortion correction signal to the output analog signal of the DAC in one embodiment (the "analog" embodiment), and applying it to the input digital signal of the DAC in another embodiment (the "digital" embodiment).

More specifically, in the "analog" embodiment, illustrated in FIG. 5A, the DAC apparatus comprises a delay module, a distortion correction module, a sin(x)/x compensation filter, a main DAC, an LSB DAC, and a correction DAC. The distortion correction module is adapted to generate a correction sequence from at least a portion of the input digital signal to reduce the distortion from the output of the main DAC. The correction sequence may be given on the following equation:

$$d_{nc} = \Delta t \cdot ((d_n \bmod N_{LSB}) - (d_{n-1} \bmod N_{LSB})) \cdot f_c$$

where $d_n$ is a nth value of at least a portion of the input digital signal, $d_{n-1}$ is an (n−1)th value of at least a portion of the input digital signal, $N_{LSB}$ is related to a number of levels covered by the second DAC, $f_c$ is the conversion rate of the DAC, and $\Delta t$ is related to the timing skew between the first and second DACs. The sin(x)/x compensation filter performs a filter operation on the correction sequence to reduce the sin(x)/x roll-off from the output analog signal of the correction DAC. The correction DAC generates the distortion correction analog signal from the distortion correction digital signal, and applies the distortion correction analog signal to the output of the main DAC. A clock circuit generates clock signals that respectively drive the main DAC and the correction DAC, but with substantially 180 degree phase difference. The 180 degree phase shift results in the output analog signal of the correction DAC being shifted by half of the sampling period T/2. The shift by half of a sampling period is necessary to properly align the correction analog signal with the main DAC output analog signal. And, the delay module delays the input digital signal to the main DAC so that it is timely aligned with the distortion correction analog signal.

In the "digital" embodiment, illustrated in FIG. 6A, the DAC apparatus comprises a delay module, a distortion correction module, a T(jω) compensation filter, an adder, and main DAC, and an LSB DAC. The distortion correction module is adapted to generate a correction sequence from at least a portion of the input digital signal per the equation in the previous paragraph, to reduce the distortion from the output of the main DAC. The T(jω) compensation filter performs a filter operation on the correction sequence to introduce a half of the sampling period shift and to reduce sin(x)/x roll-off from the output analog signal of the main DAC. The adder adds the distortion correction digital signal to the input digital signal delayed by the delay module. And, the main DAC generates the output analog signal from the output of the adder.

DETAILED DESCRIPTION OF THE EXEMPLARY EMBODIMENTS

Figure 1:
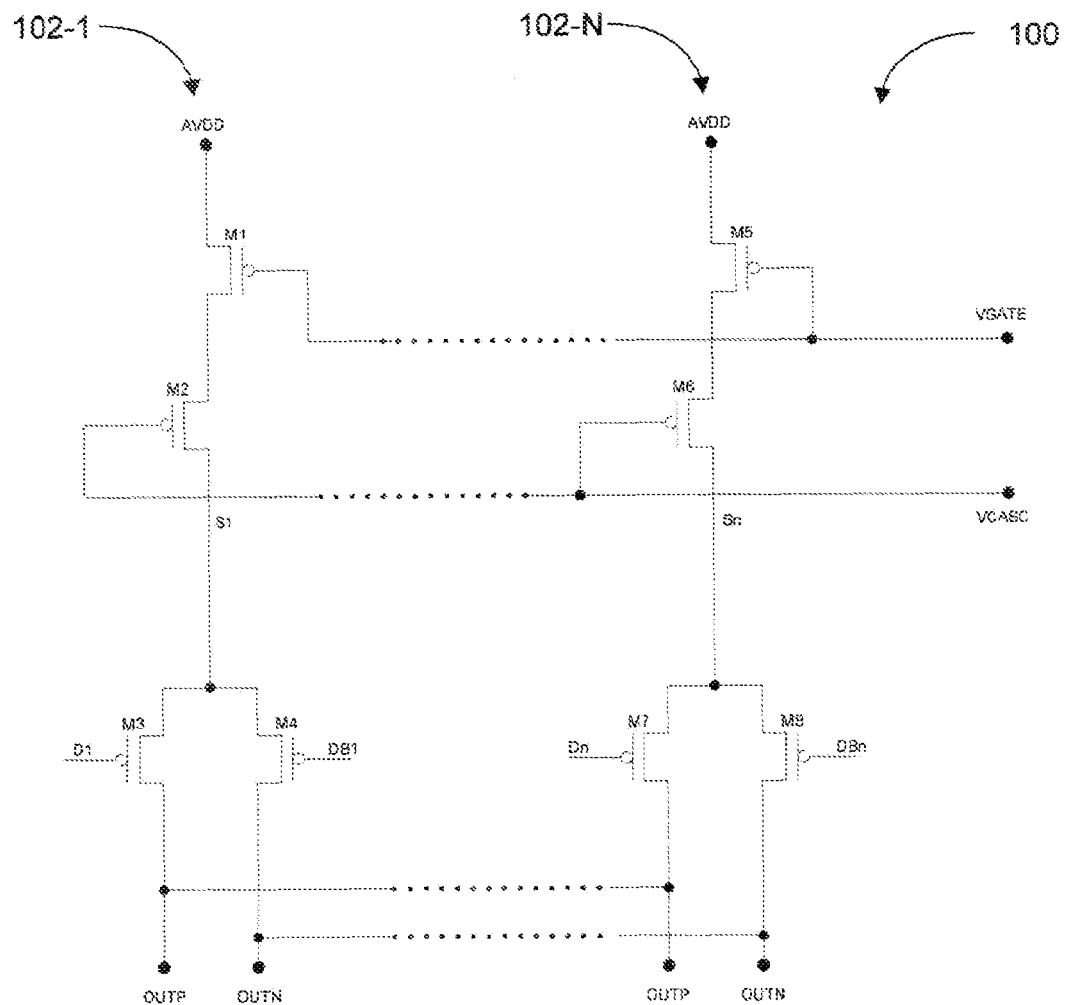
FIG. 1 illustrates a schematic diagram of an exemplary current steering digital-to-analog converter (DAC)
Figure 2:
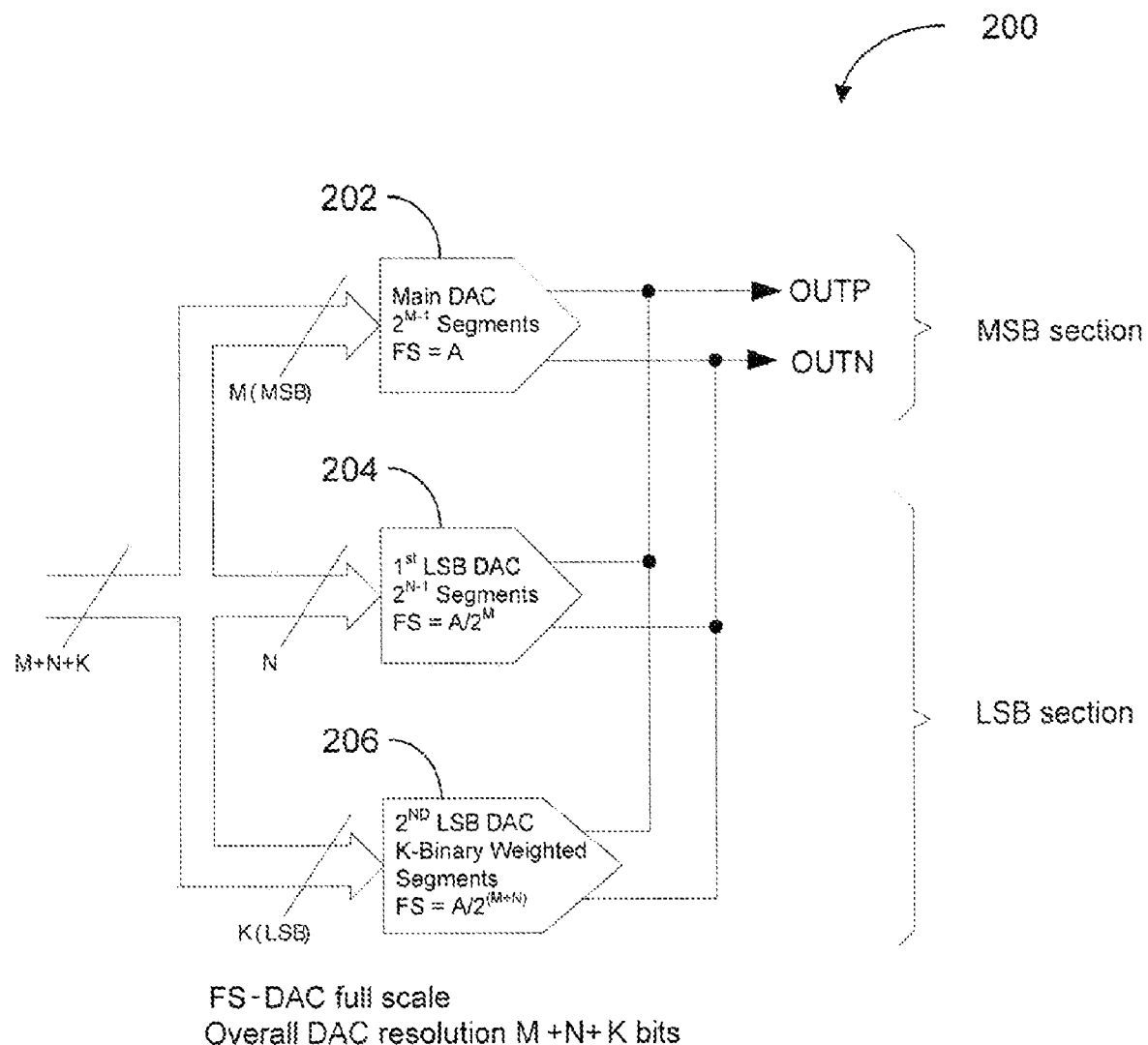
FIG. 2 illustrates a block and schematic diagram of another exemplary DAC circuit.
Figure 3A:
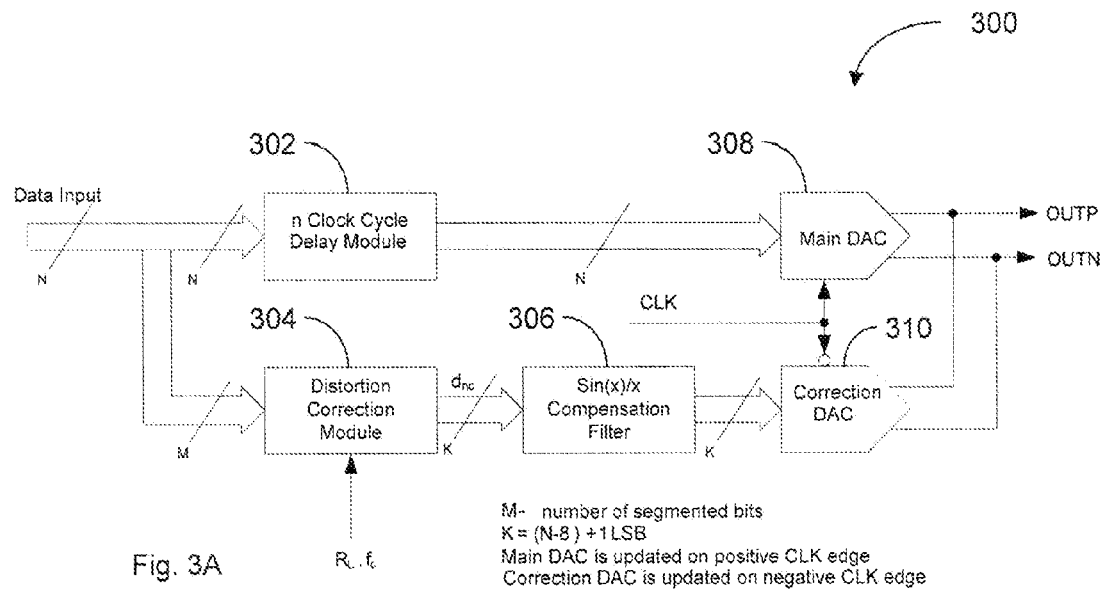
FIG. 3A illustrates a block diagram of a first exemplary DAC circuit in accordance with an embodiment of the invention.

FIG. 3A illustrates a block diagram of an exemplary DAC circuit 300 in accordance with an embodiment of the invention. The DAC circuit 300 is adapted to reduce distortion, such as third order harmonic distortion, from the output of its main DAC. In this particular embodiment, a distortion correction analog signal is generated and applied to the positive and negative output terminals OUTP and OUTN of the DAC circuit 300. The DAC circuit 300 comprises an n clock cycle delay module 302, a distortion correction module 304, a sin(x)/x compensation filter 306, a main DAC 308, and a correction DAC 310.

More specifically, the input digital signal, which may include N bit length codes, is applied to the input of the n clock cycle delay module 302. The most significant bits M of the input digital signal are applied to the input of the distortion correction module 304. The output of the n clock cycle delay module 302, which may also produce N-bit length codes, is coupled to the input of the main DAC 308. The output of the distortion correction module 304, which may produce K-bit words, is coupled to the input of the sin(x)/x compensation filter module 306. The output of the sin(x)/x compensation filter module 306, which may produce K-bit length codes, is coupled to the input of the correction DAC 310. The positive and negative output terminals OUTP and OUTN of the main and correction DACs 308 and 310 are coupled together. A clock circuit generates clock signals that respectively drive the main DAC 308 and the correction DAC 310, but with substantially 180 phase difference as indicated by the inverted symbol at the clock input of the correction DAC 310.

As discussed in more detail below, the distortion correction module 304 is adapted to correct for third order harmonic distortion that would otherwise be generated at the output of the main DAC 308 due to charge transfer effects at the summing nodes and low output impedance, both during segment switching operations, as discussed in the Background section. The sin(x)/x compensation filter module 306 is adapted to correct for the sin(x)/x roll-off frequency response of the correction DAC 310. The n clock cycle delay 302 is adapted to delay the input digital signal to compensate for the processing delay associated with the distortion correction module 304 and the sin(x)/x compensation filter 306 so that the correction signal timely correlates with the input digital signal. The clock signal, applied at substantially opposite phases to the main and correction DACs 308 and 310, is adapted to correct a T/2 time shift produce by the frequency response of the correction DAC 310.

The distortion correction operates as follows. The charge injected to the DAC output due to the charge transfer effect during a switching event may be represented as follows:

$$q_n = -\alpha \cdot V_{n-1} \cdot \frac{|V_n - V_{n-1}|}{I_S \cdot R_L} \qquad \text{Eq. 1}$$

Where α is a proportionality constant, $V_n$ is the voltage at the output of the uncompensated main DAC 308 at time nT, $V_{n-1}$ is the voltage at the output of the uncompensated main DAC 308 at time (n−1)T, $I_S$ is the segment current, and $R_L$ is the output load resistance. The sequence $q_n$ represents the amount of charge injected to the DAC output at each code transition. The output voltage of the uncompensated main DAC 308 may be expressed in terms of the input signal code as follows:

$$V_n = \left(\frac{d_n}{d_{FS}} - 0.5\right) \cdot I_{FS} \cdot R_L \qquad \text{Eq. 2}$$

Where $d_n$ is the DAC input signal code, $d_{FS}$ is the full scale code, and IFS is substantially the full scale current.

Using equation 2, equation 1 can be rewritten as follows:

$$q_n = -\beta \cdot \left(\frac{d_{n-1}}{d_{FS}} - 0.5\right) \cdot \frac{|d_n - d_{n-1}|}{d_{FS}} \cdot I_{FS} \cdot R_L \qquad \text{Eq. 3}$$

Where $\beta$ is a proportionality constant that is related to the integrated circuit process parameters. The constant $\beta$ may be determined empirically or by simulation, for example, by measuring the distortion at the output of the DAC circuit 300 and then adjusting $\beta$ until the distortion is substantially minimized. The constant $\beta$ may be stored in a non-volatile manner within the distortion correction module 304. From equation 3, the correction sequence $d_{nc}$, which may form the basis of a distortion correction signal that substantially cancels or reduces the distortion at the output of the DAC, may be expressed as follows:

$$d_{nc} = \beta \cdot \left(\frac{d_{n-1}}{d_{FS}} - 0.5\right) \cdot |d_n - d_{n-1}| \cdot R_L \cdot f_c \qquad \text{Eq. 4}$$

where $f_c$ is the conversion rate. The values of the load resistance $R_L$ and the conversion rate $f_c$ may be specific to the particular application, and may be provided as inputs to the distortion correction module 304. Thus, the distortion correction module 304 generates the correction sequence $d_{nc}$ in order to reduce the distortion at output of the DAC circuit 300.

The distortion correction module 304 provides the correction sequence $d_{nc}$ to the sin(x)/x compensation filter 306. The sin(x)/x compensation filter 306 reduces or eliminates the sin(x)/x roll-off response that would otherwise be present at the output of the correction DAC 310. The sin(x)/x compensation filter 306 may generate a distortion correction digital signal having a code length of K, which may be equal to N−8+1 LSB. The output of the sin(x)/x compensation filter 306 is applied to the correction DAC 310 which converts the distortion correction digital signal into a distortion correction analog signal. As previously discussed, the phase of the clock applied to the correction DAC 310 is substantially 180 degree apart from the phase of the clock applied to the main DAC 308. As an example, the main DAC 308 may be updated on the positive clock edge, whereas the correction DAC 310 may be updated on the negative CLK edge. The 180 phase shift results in the output analog signal of the correction DAC being shifted by half of the sampling period T/2. The shift by half of a sampling period is necessary to properly align the correction analog signal with the main DAC output analog signal. The sin(x)/x compensation filter 306 along with the half of the sampling period shift approximate a transfer function represented as follows:

$$G(j\omega) = \frac{(\omega T/2)}{\sin(\omega T/2)} \cdot e^{j\omega(T/2)} \qquad \text{Eq. 5}$$

The sin(x)/x compensation filter approximates first factor in Eq. 5 and the half of the clock cycle shift in the output analog signal of the correction DAC is responsible for the second factor in Eq. 5.

The correction DAC 310 generates the distortion correction analog signal, which is then added to the output signal of the main DAC 308. The outputs of both DACs 308 and 310 operate in current mode, so connecting them in parallel results in the addition of the output signals. As previously discussed, the n-clock cycle delay module 302 in the input data path of the main DAC 308 is employed to balance the delay introduced by the compensation path comprising the distortion correction module 304, the sin(x)/x compensation filter 306, and the correction DAC 310.

The main DAC input code may have a length of N. The M most significant bits of the DAC input code may be used to calculate the correction sequence $d_{nc}$. For example, if there are thirty one main segments in the main DAC 308, then M may be equal to five. Using only the M most significant bits for the correction sequence calculation allows for simpler implementation of the digital logic, without any significant loss in the efficiency of the distortion cancellation. As an example, the correction DAC 310 may have a full scale equal to 1/256 of the full scale of the main DAC 308. This allows for the suppression of the third order harmonic distortion having initial level of up to −48 dBFS. This is just an example, and the full scale of the main DAC 308 should be set according to the desired reduction of the third order harmonic distortion. The resolution of the correction DAC 310 may be set such that its quantization step is two times smaller than the quantization step of the main DAC 308. This may be achieved by adding one bit to the correction DAC on the LSB side. The increased resolution of the correction DAC limits the accumulation of the truncation error.

Figure 3B:
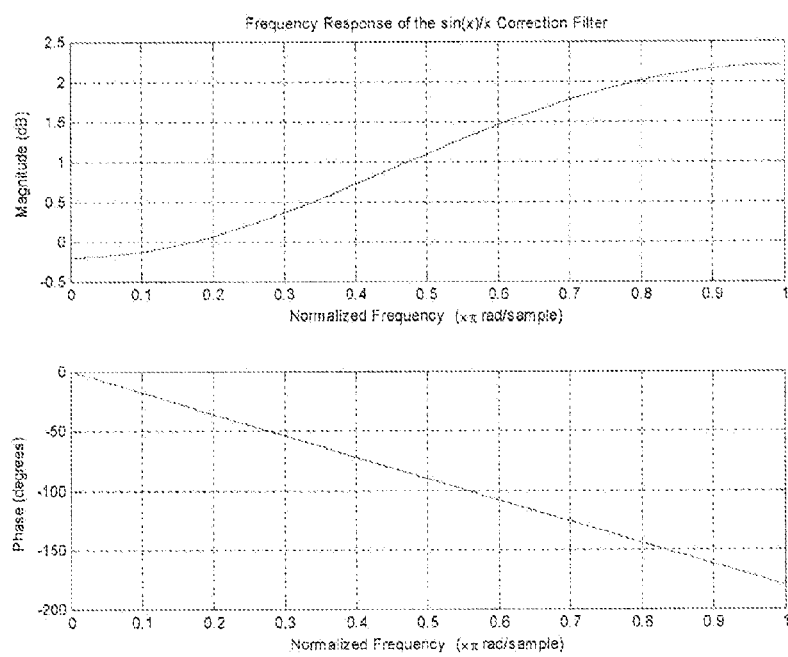
FIG. 3B illustrates a graph of a frequency response of an exemplary sin(x)/x compensation filter used in the first exemplary DAC circuit in accordance with another embodiment of the invention.

FIG. 3B illustrates a graph of a frequency response of an exemplary sin(x)/x compensation filter 306 used in the exemplary DAC circuit 300 in accordance with another embodiment of the invention. The sin(x)/x compensation filter 306 may be implemented as a second order, linear phase FIR filter. The following table list possible filter coefficients for the FIR implementation of the sin(x)/x compensation filter 306:

| Sin(x)/x correction filter coefficients | |
| --- | --- |
| Coefficient | Value |
| $a_0$ | −7.817897768e−002 |
| $a_1$ | 1.13359517636e+000 |
| $a_2$ | −7.817897768e−002 |

Other filter types may be implemented for the sin(x)/x compensation filter 306.

Figure 3C:
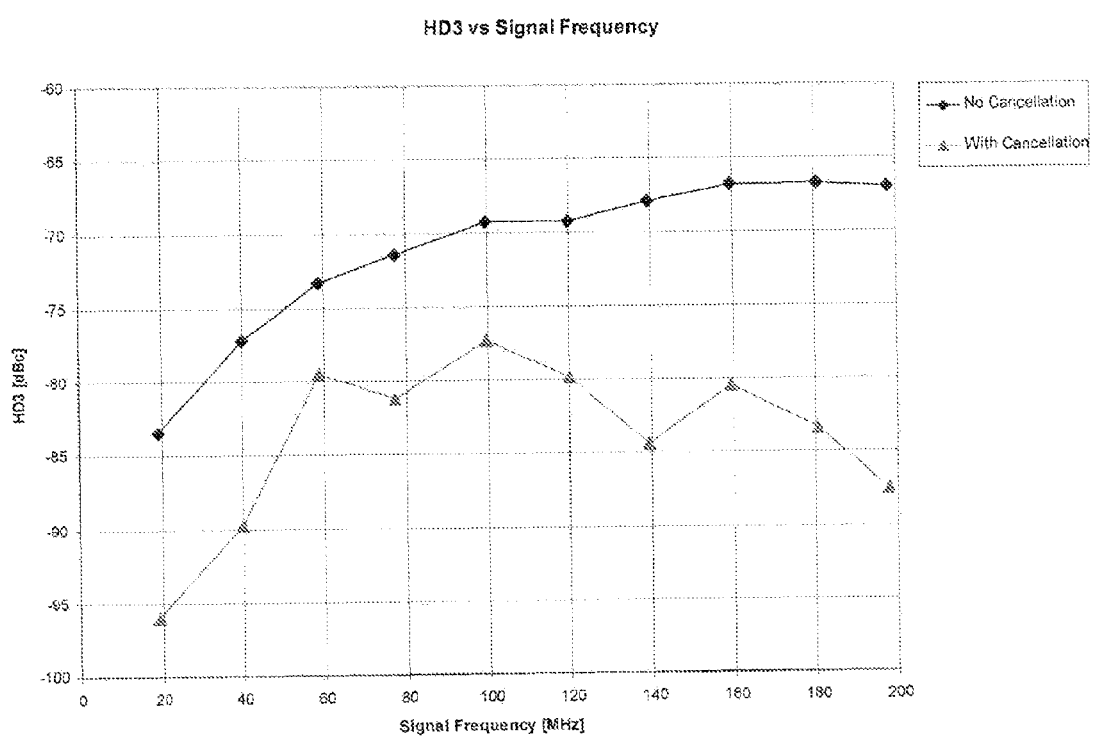
FIG. 3C illustrates a graph comparing the third order harmonic frequency response of an uncompensated DAC with the third order harmonic frequency response of the first exemplary DAC in accordance with another embodiment of the invention.

FIG. 3C illustrates a graph comparing the third order harmonic frequency response of an uncompensated DAC with the third order harmonic frequency response of the exemplary DAC circuit 300 in accordance with another embodiment of the invention. The y- or vertical axis of the graph represents the suppression of the third order harmonic distortion from −100 dB to −60 dB. The x- or horizontal axis represents the frequency of the input signal from 0 Hz to 200 MHz. The response indicated in the graph with diamond symbols represents the third order harmonic distortion of an uncompensated DAC. The response indicated in the graph with triangle symbols represents the third order harmonic distortion of the DAC 300. In this example, a 16-bit main DAC was used running at a 500 MHz update rate outputting a full scale single tone signal. The graph illustrates that the DAC circuit 300 reduced third order harmonic distortion from approximately 7 dB to 20 dB.

Figure 4A:
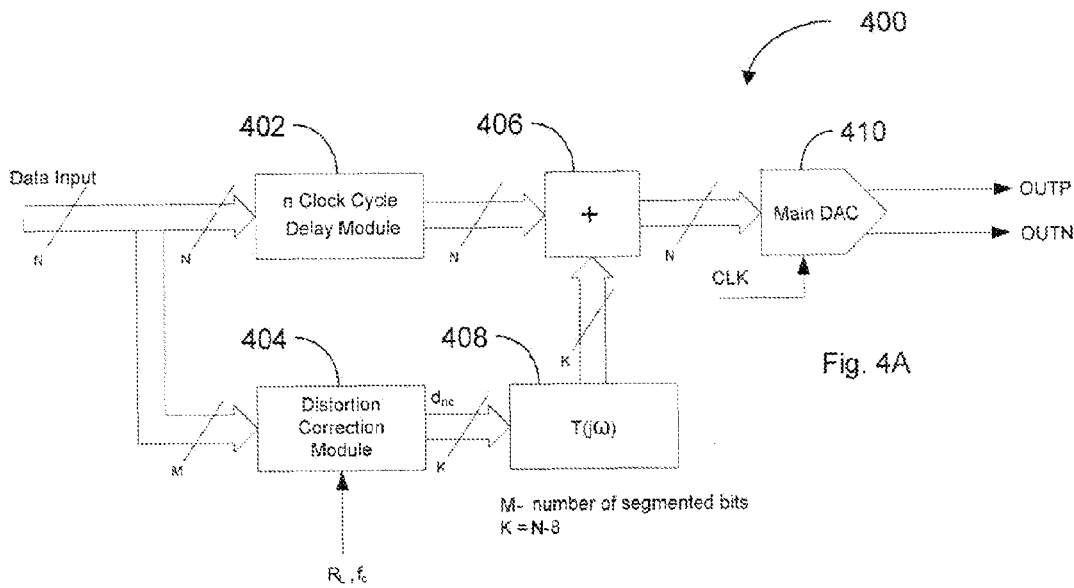
FIG. 4A illustrates a block diagram of a second exemplary DAC circuit in accordance with another embodiment of the invention.

FIG. 4A illustrates a block diagram of another exemplary DAC circuit 400 in accordance with another embodiment of the invention. In the previously-discussed DAC circuit 300, the compensation was performed in the analog domain by adding the distortion correction analog signal produced by the correction DAC 310 to the output of the main DAC 308. In the DAC circuit 400, the compensation is performed in the digital domain by adding a distortion correction digital signal to the input digital signal of the main DAC.

In particular, the DAC circuit 400 comprises an n clock cycle delay module 402, a distortion correction module 404, an adder 406, a $T(j\omega)$ compensation filter 408, and a main DAC 410. The input of the n clock cycle delay module 402 is adapted to receive an N-bit input digital signal. The output of the n clock cycle delay module 402 is coupled to a first input of the adder 406. The input of the distortion correction module 404 is adapted to receive a defined number M of the most significant bits of the input digital signal. The distortion correction module 404 generates the correction sequence $d_{nc}$ as per equation 4 discussed above, and may also be adapted to receive inputs related to the load resistance $R_L$ and the conversion rate $f_c$ for the particular application that the DAC circuit 400 is employed.

The output of the distortion correction module 404 is coupled to the compensation filter 408, which may have a transfer function represented as $T(j\omega)$. The $T(j\omega)$ compensation filter 408 provides $\sin(x)/x$ amplitude compensation and also shifts the correction sequence $d_{nc}$ by half a clock cycle $T/2$. The shift by half of a clock cycle is necessary to properly align the correction digital signal with the main DAC input digital signal. The $T(j\omega)$ compensation filter 408 thus generates a distortion correction digital signal, which may have a width of K-bits, where K is equal to N–8. The output of the $T(j\omega)$ compensation filter 408 is coupled to a second input of the adder 406. The adder 406 then adds the delayed input digital signal from the output of the n clock cycle delay module 402 to the distortion correction digital signal at the output of the $T(j\omega)$ compensation filter 408 to generate the input signal to the main DAC 410. Thus, the input signal to the main DAC 410 includes a compensated input digital signal so that the DAC 410 generates a corresponding output analog signal with reduced third order harmonic distortion.

Similar to the DAC circuit 300, the correction sequence $d_{nc}$ may be calculated based on the M most significant bits of the input digital word. The values of the load resistance $R_L$ and the conversion rate $f_c$ are typically provided specific to the application. The value of β used in equation 4 may be determined empirically or by simulation, as previously discussed, and may be stored in the distortion correction module 404 in a non-volatile manner. As previously discussed, the calculated sequence passes through the $T(j\omega)$ compensation filter 408 and is digitally added to the DAC input word. Since the amplitude of the correction signal may be much lower than the DAC full scale, the length of the word at the output of the filter 408 can be significantly reduced. In this example, the distortion correction digital signal may be eight bits shorter than the DAC input word, and provides for a suppression of the third order harmonic to a level of –48 dBFS.

Figure 4B:
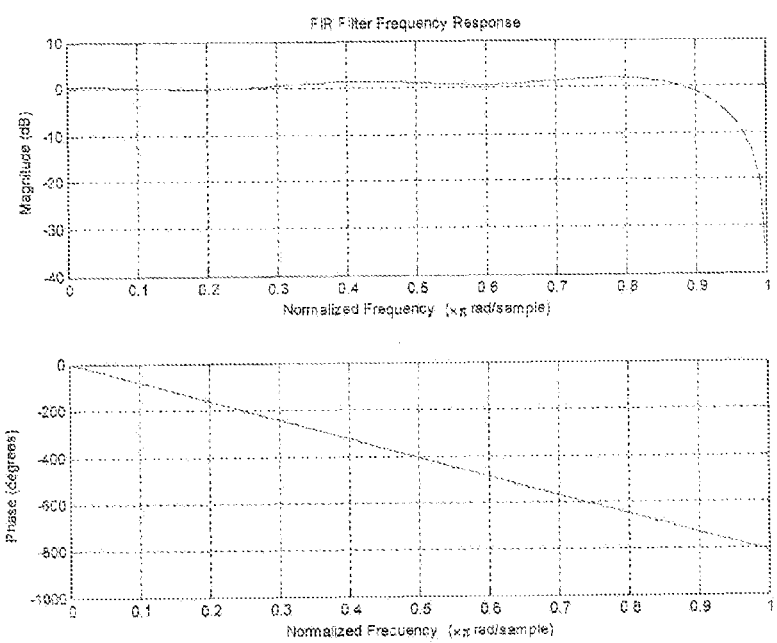
FIG. 4B illustrates a graph of a frequency response of an exemplary T(jω) compensation filter used in the second exemplary DAC circuit in accordance with another embodiment of the invention.

FIG. 4B illustrates a graph of a frequency response of the exemplary $T(j\omega)$ compensation filter 408 used in the exemplary DAC circuit 400 in accordance with another embodiment of the invention. The $T(j\omega)$ compensation filter 408 may be implemented as an $9^{th}$ order, linear phase FIR filter. The odd order FIR filter provides the required T/2 shift, but it has an undesired transmission zero at the Nyquist frequency. Accordingly, the FIR filter is configured to compensate for the $\sin(x)/x$ roll-off in the frequency range up to 0.85 of the Nyquist frequency. Above the 0.85 Nyquist frequency, the filter gain drops rapidly to reach the transmission zero at the Nyquist frequency. This means that, for this type of filter, the distortion cancellation may be effective only if the frequency of the third order harmonic is within the filter passband. However, in many practical applications, the frequencies close to the Nyquist frequency are outside of the useful DAC bandwidth, and the spurious signals in this frequency range may be filtered out. The following table lists possible filter coefficients for the FIR implementation of the $T(j\omega)$ compensation filter 408:

| FIR filter coefficients | |
|---|---|
| Coefficient | Value |
| $a_0$ | 5.909012733519176e–002 |
| $a_1$ | –7.693476266470423e–002 |
| $a_2$ | 1.229945718372693e–001 |
| $a_3$ | –2.550450888117438e–001 |
| $a_4$ | 6.838926635725998e–001 |
| $a_5$ | 6.838926635725998e–001 |
| $a_6$ | –2.550450888117438e–001 |
| $a_7$ | 1.229945718372693e–001 |
| $a_8$ | –7.693476266470423e–002 |
| $a_9$ | 5.909012733519176e–002 |

Other filter types may be implemented for the $T(j\omega)$ compensation filter 408.

Figure 4C:
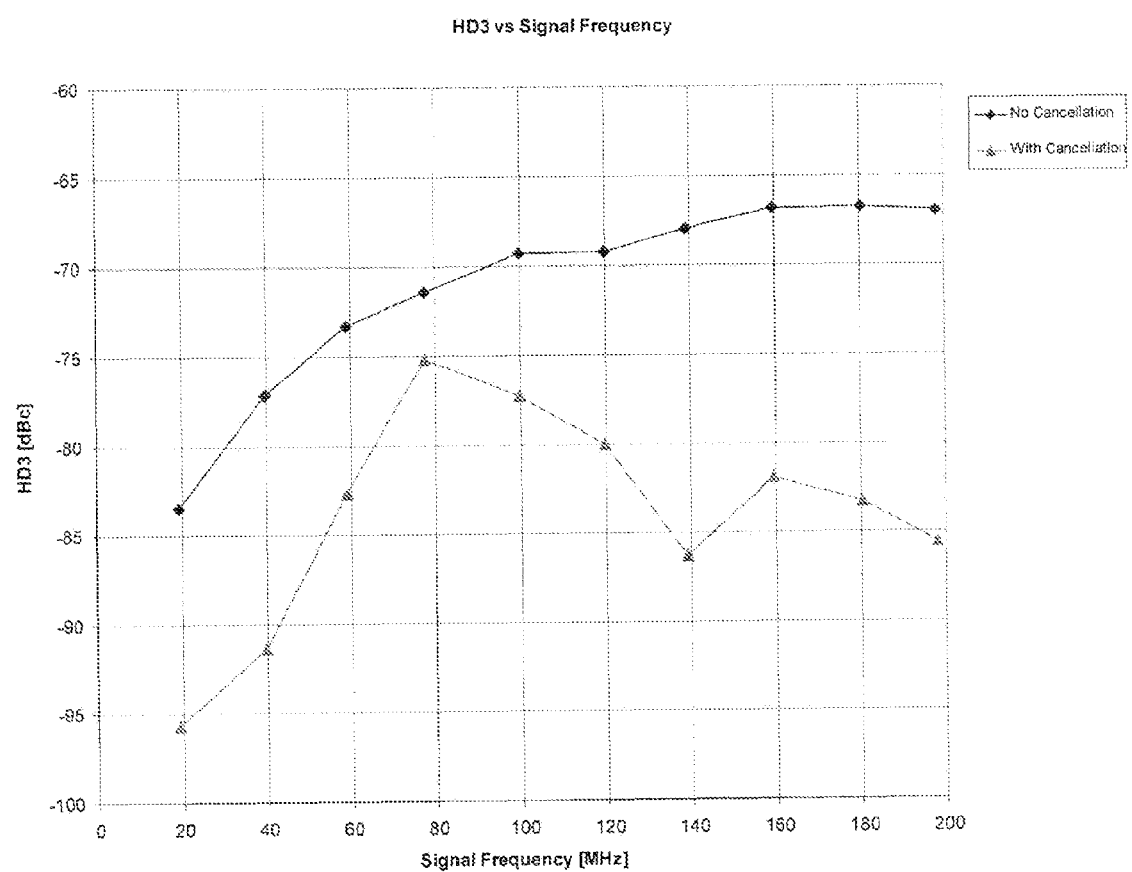
FIG. 4C illustrates a graph comparing the third order harmonic frequency response of an uncompensated DAC with the third order harmonic frequency response of the second exemplary DAC in accordance with another embodiment of the invention.

FIG. 4C illustrates a graph comparing the third order harmonic frequency response of an uncompensated DAC with the third order harmonic frequency response of the exemplary DAC circuit 400 in accordance with another embodiment of the invention. The y- or vertical axis of the graph represents the suppression of the third order harmonic distortion from –60 dB to –100 dB. The x- or horizontal axis represents the frequency of the input signal from 0 Hz to 200 MHz. The response indicated in the graph with diamond symbols represents the third order harmonic distortion of an uncompensated DAC. The response indicated in the graph with triangle symbols represents the third order harmonic distortion of the DAC 400. In this example, a 16-bit main DAC was used running at a 500 MHz update rate outputting a full scale single tone signal. The graph illustrates that the DAC circuit 400 reduced third order harmonic distortion from approximately 4 dB to 20 dB.

Figure 6A:
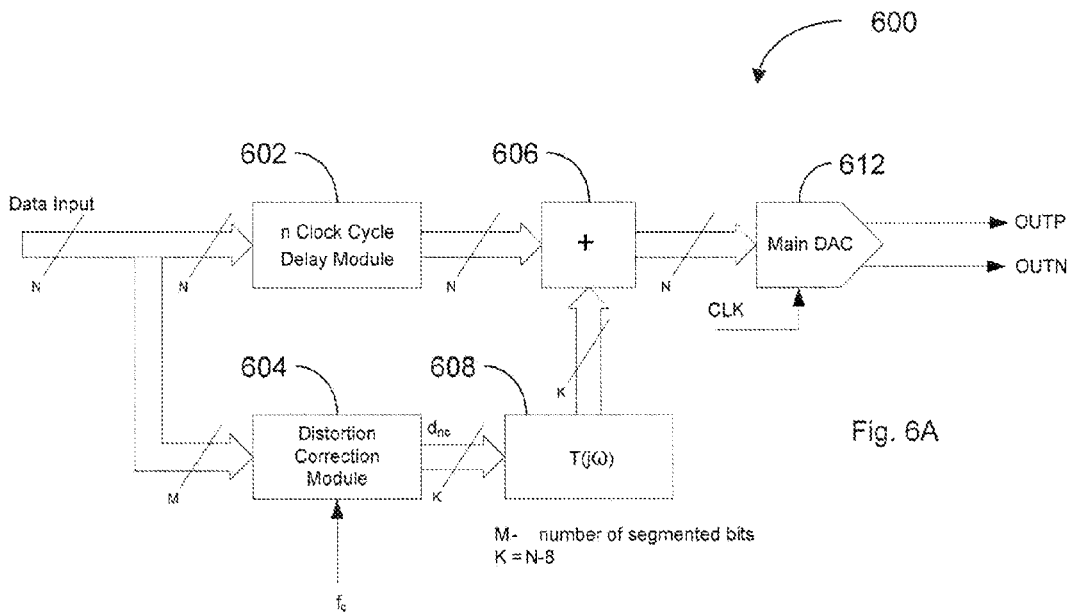
FIG. 6A illustrates a block diagram of a fourth exemplary DAC circuit in accordance with another embodiment of the invention.

FIG. 6A illustrates a block diagram of yet another exemplary DAC circuit 500 in accordance with another embodiment of the invention. The DAC circuit 500 is adapted to reduce distortion at the output of a main DAC due to timing skew with one or more least significant bits DACs. The DAC 500 configuration is basically the same as the configuration of DAC 300 previously discussed, except that the distortion correction filter is particularly adapted to correct for the distortion due to the timing skew instead of the distortion caused by switching. Specifically, the DAC 500 comprises an n clock cycle delay module 502, a distortion correction module 504, a $\sin(x)/x$ compensation filter 506, a main DAC 508, and a correction DAC 510. Since the elements 502, 506, 508 and 510 have been previously discussed in detail with regard to the previous embodiments, the following describes in detail only the distortion correction module 504.

The charge that is injected to a DAC output from an LSB DAC due to timing skew may be expressed as follows:

$$q_n = \Delta t \cdot (I_{LSBn} - I_{LSBn-1}) \qquad \text{Eq. 6}$$

where Δt is the LSB section timing skew, positive if the LSB section is delayed, and $I_{LSBn}$ is the LSB section output current at time nT. In terms of the DAC input code, equation 6 may be rewritten as follows:

$$q_n = -\Delta t \cdot ((d_n \bmod N_{LSB}) - (d_{n-1} \bmod N_{LSB})) \cdot \frac{I_{FS}}{d_{FS}} \quad \text{Eq. 7}$$

where $d_n$ is the DAC input code, $N_{LSB}$ is the number of levels covered by the LSB section, $d_{FS}$ is the full scale code, and IFS is the full scale current. From equation 7, the correction sequence $d_{nc}$ may be expressed as follows:

$$d_{nc} = \Delta t \cdot ((d_n \bmod N_{LSB}) - (d_{n-1} \bmod N_{LSB})) \cdot f_c \quad \text{Eq. 8}$$

In order to compensate for the DAC sin(x)/x roll-off frequency response and to properly time align the correction signal at the DAC output, the correction sequence $d_{nc}$ is passed through the sin(x)/x correction filter 506, and the correction DAC clock is shifted by 180 degree, resulting in half of the clock cycle shift in the output analog signal of the correction DAC 510. The sin(x)/x correction filter and half of the clock cycle shift of the correction DAC output signal may result in overall frequency response approximating the following equation:

$$G(j\omega) = \frac{(\omega T/2)}{\sin(\omega T/2)} \cdot e^{j\omega(T/2)} \quad \text{Eq. 9}$$

The sin(x)/x compensation filter approximates first factor in Eq. 9 and the half of the clock cycle shift in the output analog signal of the correction DAC is responsible for the second factor in Eq. 9. Equations 8 and 9 are analogous to equations 4 and 5 related to the DAC circuit 300. The only difference is in the formula used to calculate the correction sequence $d_{nc}$. Additionally, since the distortion sequence $d_{nc}$ is a function of the conversion rate $f_c$, and not of the load resistance $R_L$, the distortion correction module 504 need only receive an input related to the conversion rate and not the load resistance. Further, the value of the timing skew between the main DAC and the LSB DAC section may be determined through measurement or by simulation, and may be stored in the distortion correction module 504 in a non-volatile manner.

Figure 5A:
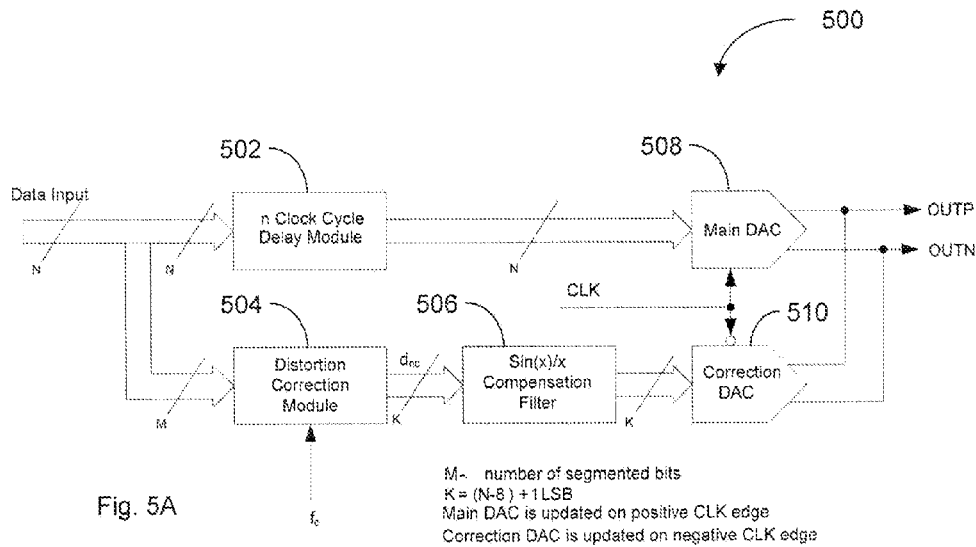
FIG. 5A illustrates a block diagram of a third exemplary DAC circuit in accordance with another embodiment of the invention.
Figure 5B:
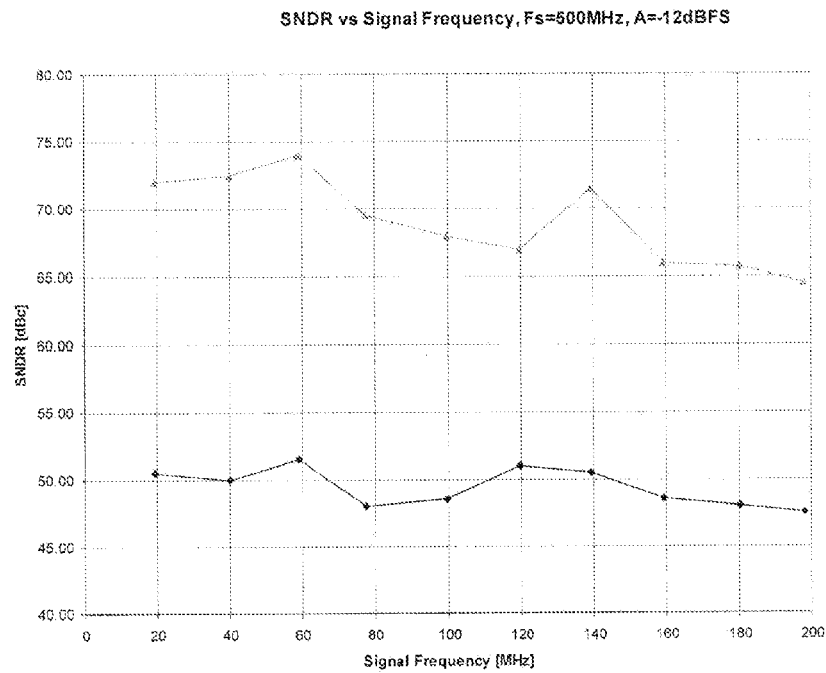
FIG. 5B illustrates a graph comparing the signal to noise and distortion ratio (SNDR) frequency response of an uncompensated DAC with the SNDR frequency response of the third exemplary DAC in accordance with another embodiment of the invention.

FIG. 5B illustrates a graph comparing the signal to noise and distortion ratio (SNDR) versus frequency of an uncompensated DAC and of the DAC circuit 500 in accordance with another embodiment of the invention. The y- or vertical axis of the graph represents the SNDR from 40 dB to 80 dB. The x- or horizontal axis represents the frequency of the input signal from 0 Hz to 200 MHz. The response indicated in the graph with diamond symbols represents the SNDR of an uncompensated DAC. The response indicated in the graph with triangle symbols represents the SNDR of the DAC circuit 500. In this example, a 16-bit main DAC was used running at a 500 MHz update rate outputting a −12 dBFS single tone signal. The graph illustrates that the DAC circuit 500 improved the SNDR by as much as 15 dB to 23 dB.

Figure 5C:
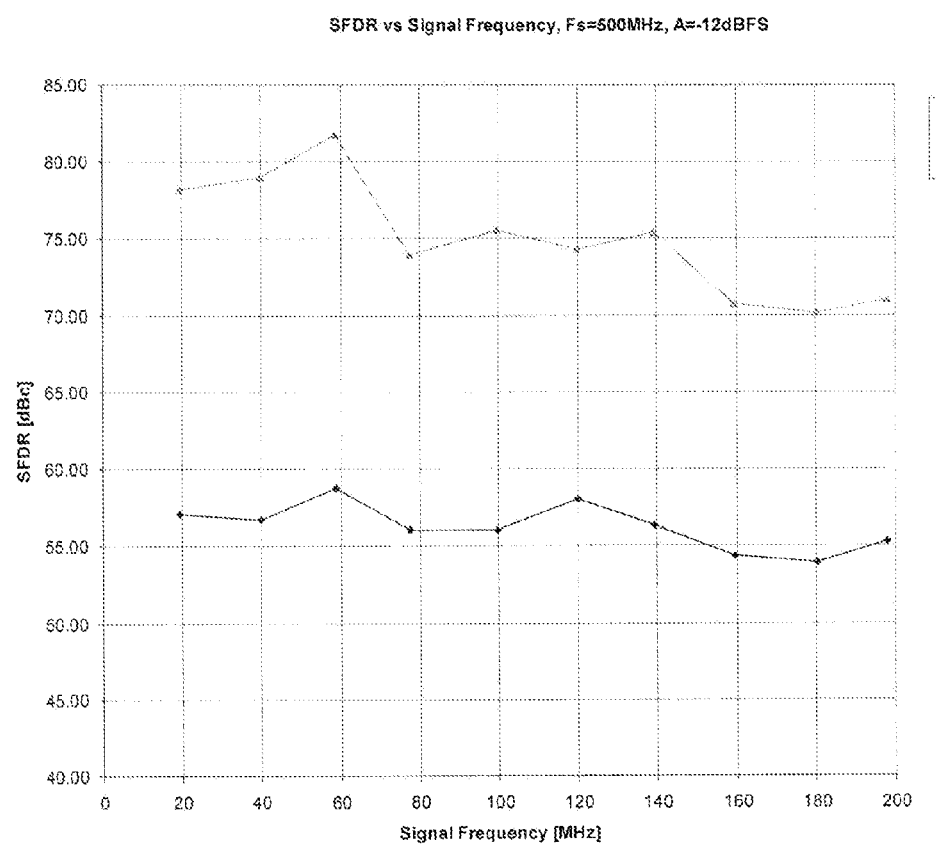
FIG. 5C illustrates a graph comparing the spurious free dynamic range (SFDR) frequency response of an uncompensated DAC with the SFDR frequency response of the third exemplary DAC in accordance with another embodiment of the invention.

FIG. 5C illustrates a graph comparing the spurious free dynamic range (SFDR) versus frequency of an uncompensated DAC and of the DAC circuit 500 in accordance with another embodiment of the invention. The y- or vertical axis of the graph represents the SFDR from 40 dB to 85 dB. The x- or horizontal axis represents the frequency of the input signal from 0 Hz to 200 MHz. The response indicated in the graph with diamond symbols represents the SFDR of an uncompensated DAC. The response indicated in the graph with triangle symbols represents the SFDR of the DAC circuit 500. In this example, a 16-bit main DAC was used running at a 500 MHz update rate outputting a −12 dBFS single tone signal. The graph illustrates that the DAC circuit 500 improved the SFDR by as much as 16 dB to 23 dB.

FIG. 6A illustrates a block diagram of a fourth exemplary DAC circuit 600 in accordance with another embodiment of the invention. As with DAC circuit 500, the DAC circuit 600 is adapted to reduce distortion at the output of a main DAC due to timing skew with the LSB DAC section. The DAC 600 configuration is basically the same as the configuration of DAC 400 previously discussed, except that the distortion correction filter is particularly adapted to correct for the distortion due to the timing skew instead of the distortion due to charge transfer effects and low output impedance as previously discussed. Specifically, the DAC 600 comprises an n clock cycle delay module 602, a distortion correction module 604, an adder 606, a T(jω) compensation filter 608, and a main DAC 610. The elements 602, 606, 608 and 610 have been previously discussed in detail with reference to the previous embodiments. The distortion correction module 604 generates the correction sequence $d_{nc}$ as per equation 8 previously discussed with reference to DAC circuit 500.

Figure 6B:
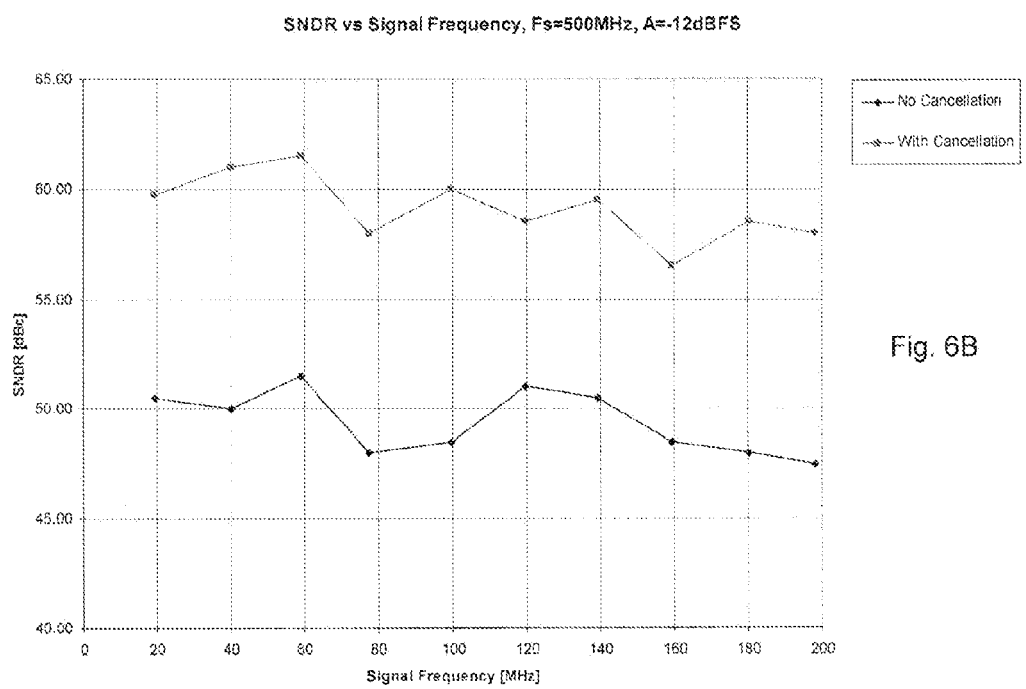
FIG. 6B illustrates a graph comparing the SNDR frequency response of an uncompensated DAC with the SNDR frequency response of the fourth exemplary DAC in accordance with another embodiment of the invention.

FIG. 6B illustrates a graph comparing the signal to noise and distortion ratio (SNDR) versus frequency of an uncompensated DAC and of the DAC circuit 600 in accordance with another embodiment of the invention. The y- or vertical axis of the graph represents the SNDR from 40 dB to 65 dB. The x- or horizontal axis represents the frequency of the input signal from 0 Hz to 200 MHz. The response indicated in the graph with diamond symbols represents the SNDR of an uncompensated DAC. The response indicated in the graph with square symbols represents the SNDR of the DAC circuit 600. In this example, a 16-bit main DAC was used running at a 500 MHz update rate outputting a −12 dBFS single tone signal. The graph illustrates that the DAC circuit 600 improved the SNDR by as much as 8 dB to 10 dB.

Figure 6C:
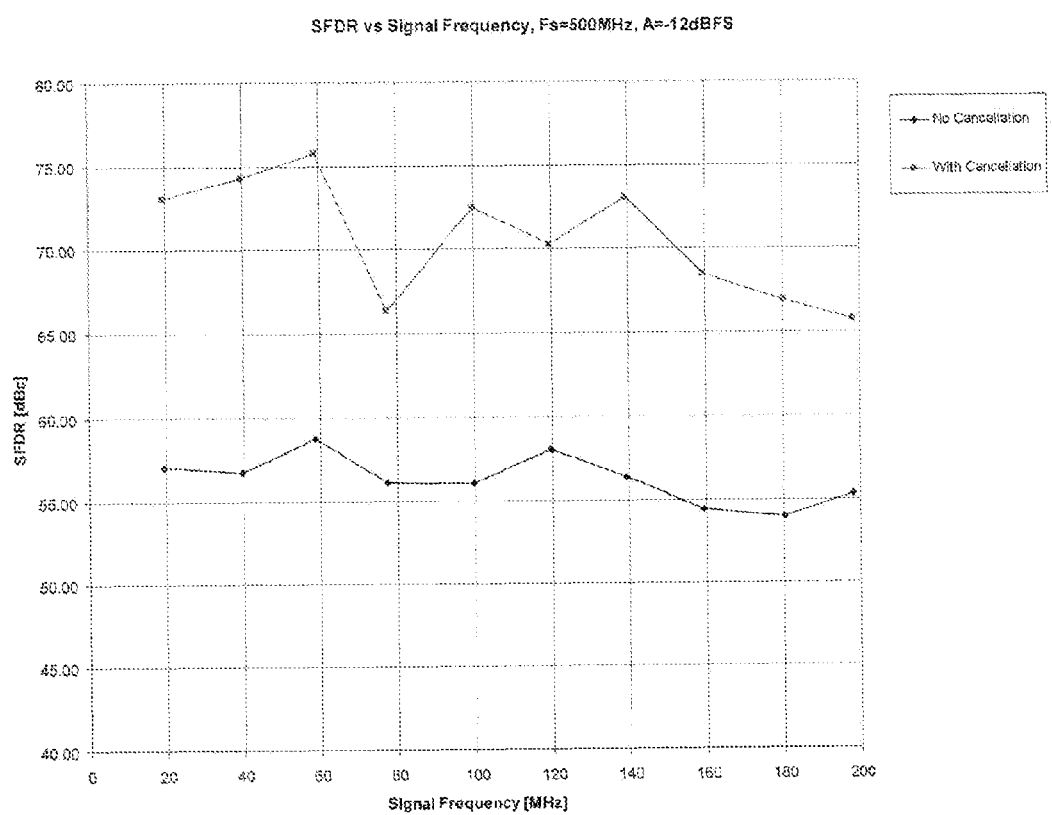
FIG. 6C illustrates a graph comparing the SFDR frequency response of an uncompensated DAC with the SFDR frequency response of the fourth exemplary DAC in accordance with another embodiment of the invention.

FIG. 6C illustrates a graph comparing the spurious free dynamic range (SFDR) versus frequency of an uncompensated DAC and of the DAC circuit 600 in accordance with another embodiment of the invention. The y- or vertical axis of the graph represents the SFDR from 40 dB to 80 dB. The x- or horizontal axis represents the frequency of the input signal from 0 Hz to 200 MHz. The response indicated in the graph with diamond symbols represents the SFDR of an uncompensated DAC. The response indicated in the graph with square symbols represents the SFDR of the DAC circuit 600. In this example, a 16-bit main DAC was used running at a 500 MHz update rate outputting a −12 dBFS single tone signal. The graph illustrates that the DAC circuit 600 improved the SFDR by as much as 10 dB to 17 dB.

While the invention has been described in connection with various embodiments, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. A digital-to-analog (DAC) apparatus, comprising:
   a digital-to-analog converter (DAC) adapted to convert an input digital signal into an output analog signal; and
   a distortion correction module adapted to reduce distortion from the output analog signal, wherein the distortion correction module generates a correction sequence $d_{nc}$ from at least a portion of the input digital signal, and wherein the correction sequence $d_n$ is substantially determined by the following equation:

$$d_{nc} = \beta \cdot \left(\frac{d_{n-1}}{d_{FS}} - 0.5\right) \cdot |d_n - d_{n-1}| \cdot R_L \cdot f_c$$

where $d_n$ is a nth value of the input digital signal, $d_{n-1}$ is an (n−1)th value of the input digital signal, $d_{FS}$ is the full scale code of the DAC, $R_L$ is the load resistance at the output of the DAC, $f_c$ is the conversion rate of the DAC, and $\beta$ is a constant.

2. The DAC apparatus of claim 1, wherein the distortion correction module is adapted to reduce third harmonic distortion from the output analog signal.

3. The DAC apparatus of claim 1, wherein the DAC comprises a current-steering DAC including a plurality of current-steering segments.

4. The DAC apparatus of claim 3, wherein the distortion arises from charge transfer effects or low output impedance as a result of one or more current-steering segments switching currents between a positive output terminal and a negative output terminal of the current-steering DAC.

5. The DAC apparatus of claim 1, wherein the distortion correction module is adapted to receive inputs related to the load resistance $R_L$ and the conversion rate $f_c$, and further wherein the constant $\beta$ is stored in a non-volatile manner.

6. The DAC apparatus of claim 1, further comprising a correction DAC adapted to generate an analog distortion correction signal based on the correction sequence $d_{nc}$, wherein the analog distortion correction signal is combined with the output analog signal to reduce the distortion therein.

7. The DAC apparatus of claim 1, further comprising a device adapted to combine the correction sequence $d_{nc}$ with the input digital signal to reduce the distortion from the output analog signal.

8. The DAC apparatus of claim 1, further comprising a filter adapted to reduce sin(x)/x roll-off from the output analog signal.

9. The DAC apparatus of claim 8, wherein the filter comprises a finite impulse response (FIR) filter.

10. The DAC apparatus of claim 8, wherein the distortion correction module generates a correction sequence $d_{nc}$ from at least a portion of the input digital signal, and the filter operates on the correction sequence $d_{nc}$ to generate a distortion correction digital signal.

11. The DAC apparatus of claim 10, further comprising a device adapted to combine the input digital signal with the distortion correction digital signal to reduce the distortion from the output analog signal.

12. The DAC apparatus of claim 10, further comprising a correction DAC adapted to generate a distortion correction analog signal based on the distortion correction digital signal, wherein the distortion correction analog signal is combined with the output analog signal to reduce the distortion therein.

13. The DAC apparatus of claim 1, further comprising a delay device adapted to delay the input digital signal by an amount related to a processing delay of the distortion correction module.

14. A digital-to-analog converter (DAC) apparatus, comprising:
a digital-to-analog converter (DAC) adapted to convert an input digital signal into an output analog signal; and
a distortion correction module adapted to reduce distortion from the output analog signal, wherein the distortion correction module generates a correction sequence $d_{nc}$ from at least a portion of the input digital signal, and wherein the distortion correction module generates the correction sequence $d_{nc}$ from only most significant bits of the input digital signal.

15. A digital-to-analog converter (DAC) apparatus, comprising:
a digital-to-analog converter (DAC) adapted to convert an input digital signal into an output analog signal;
a distortion correction module adapted to reduce distortion from the output analog signal;
a filter adapted to reduce sin(x)/x roll-off from the output analog signal, and wherein the filter has a transfer function substantially as follows:

$$G(j\omega) = \frac{(\omega T/2)}{\sin(\omega T/2)} \cdot e^{j\omega(T/2)}$$

where T is the period of a conversion rate of the DAC.

16. A digital-to-analog converter (DAC) apparatus, comprising:
a digital-to-analog converter (DAC) adapted to convert an input digital signal into an output analog signal;
a distortion correction module adapted to reduce distortion from the output analog signal;
a filter adapted to reduce sin(x)/x roll-off from the output analog signal, and wherein the filter has a transfer function substantially as follows:

$$G(j\omega) = \frac{(\omega T/2)}{\sin(\omega T/2)}$$

where T is the period of a conversion rate of the DAC.

17. A digital-to-analog converter (DAC) apparatus, comprising:
a digital-to-analog converter (DAC) adapted to convert an input digital signal into an output analog signal;
a distortion correction module adapted to reduce distortion from the output analog signal;
a filter adapted to reduce sin(x)/x roll-off from the output analog signal, wherein the distortion correction module generates a correction sequence $d_{nc}$ from at least a portion of the input digital signal, and the filter operates on the correction sequence $d_{nc}$ to generate a distortion correction digital signal;
a correction DAC adapted to generate a distortion correction analog signal based on the distortion correction digital signal, wherein the distortion correction analog signal is combined with the output analog signal to reduce the distortion therein; and
a clock circuit adapted to generate a first clock signal for the DAC and a second clock signal for the correction DAC, wherein a phase difference between the first and second clock signals is approximately 180 degrees.

18. A digital-to-analog (DAC) apparatus, comprising:
a first DAC adapted to convert a first portion of an input digital signal into a first portion of an output analog signal;
a second DAC adapted to convert a second portion of the input digital signal into a second portion of the output analog signal, wherein an output of the first DAC is coupled to an output of the second DAC to combine the first and second portions of the output analog signal; and a distortion correction module adapted to reduce distortion from the output analog signal, wherein the distortion correction module generates a correction sequence $d_{nc}$ from at least a portion of the input digital signal, and wherein the correction sequence $d_{nc}$ is substantially determined by the following equation:

$$d_{nc} = \Delta t \cdot ((d_n \bmod N_{LSB}) - (d_{n-1} \bmod N_{LSB})) \cdot f_c$$

where $d_n$ is a nth value of at least a portion of the input digital signal, $d_{n-1}$ is an (n−1)th value of at least a portion of the input digital signal, $N_{LSB}$ is related to a number of levels covered by the second DAC, $f_c$ is the conversion rate of the DAC, and $\Delta t$ is related to the timing skew between the first and second DACs.

19. The DAC apparatus of claim 18, wherein the distortion correction module is adapted to reduce third harmonic distortion from the output analog signal.

20. The DAC apparatus of claim 18, wherein the distortion arises from the timing skew between the first and second DACs.

21. The DAC apparatus of claim 18, wherein the distortion correction module is adapted to receive inputs related to the conversion rate $f_c$, and further wherein the timing skew $\Delta t$ is stored in a non-volatile manner.

22. The DAC apparatus of claim 18, further comprising a correction DAC adapted to generate a distortion correction analog signal based on the correction sequence $d_{nc}$, wherein the distortion correction analog signal is combined with the output analog signal to reduce the distortion therein.

23. The DAC apparatus of claim 18, further comprising a device adapted to combine the correction sequence $d_{nc}$ with the input digital signal to reduce the distortion from the output analog signal.

24. The DAC apparatus of claim 18, wherein the distortion correction module generates the correction sequence $d_{nc}$ from only most significant bits of the input digital signal.

25. The DAC apparatus of claim 18, further comprising a filter adapted to reduce sin(x)/x roll-off from the output analog signal.

26. The DAC apparatus of claim 25, wherein the filter comprises a finite impulse response (FIR) filter.

27. The DAC apparatus of claim 25, wherein the distortion correction module generates a correction sequence $d_{nc}$ from at least a portion of the input digital signal, and the filter operates on the correction sequence $d_{nc}$ to generate a distortion correction digital signal.

28. The DAC apparatus of claim 27, further comprising a device adapted to combine the input digital signal with the distortion correction digital signal to reduce the distortion from the output analog signal.

29. The DAC apparatus of claim 27, further comprising a correction DAC adapted to generate a distortion correction analog signal based on the distortion correction digital signal, wherein the distortion correction analog signal is combined with the output analog signal to reduce the distortion therein.

30. The DAC apparatus of claim 18, further comprising a delay device adapted to delay the input digital signal by an amount related to a processing delay of the distortion correction module.

31. A digital-to-analog converter (DAC) apparatus, comprising:

a first DAC adapted to convert a first portion of an input digital signal into a first portion of an output analog signal;

a second DAC adapted to convert a second portion of the input digital signal into a second portion of the output analog signal, wherein an output of the first DAC is coupled to an output of the second DAC to combine the first and second portions of the output analog signal;

a distortion correction module adapted to reduce distortion from the output analog signal; and a filter adapted to reduce sin(x)/x roll-off from the output analog signal, wherein the filter has a transfer function substantially as follows:

$$G(j\omega) = \frac{(\omega T/2)}{\sin(\omega T/2)} \cdot e^{j\omega(T/2)}$$

where T is the period of a conversion rate of the first DAC.

32. A digital-to-analog converter (DAC) apparatus, comprising:

a first DAC adapted to convert a first portion of an input digital signal into a first portion of an output analog signal;

a second DAC adapted to convert a second portion of the input digital signal into a second portion of the output analog signal, wherein an output of the first DAC is coupled to an output of the second DAC to combine the first and second portions of the output analog signal;

a distortion correction module adapted to reduce distortion from the output analog signal; and a filter adapted to reduce sin(x)/x roll-off from the output analog signal, wherein the filter has a transfer function substantially as follows:

$$G(j\omega) = \frac{(\omega T/2)}{\sin(\omega T/2)}$$

where T is the period of a conversion rate of the first DAC.

33. A digital-to-analog converter (DAC) apparatus, comprising:

a first DAC adapted to convert a first portion of an input digital signal into a first portion of an output analog signal;

a second DAC adapted to convert a second portion of the input digital signal into a second portion of the output analog signal, wherein an output of the first DAC is coupled to an output of the second DAC to combine the first and second portions of the output analog signal;

a distortion correction module adapted to reduce distortion from the output analog signal; and a filter adapted to reduce sin(x)/x roll-off from the output analog signal, wherein the distortion correction module generates a correction sequence $d_{nc}$ from at least a portion of the input digital signal, and the filter operates on the correction sequence $d_{nc}$ to generate a distortion correction digital signal; and a clock circuit adapted to generate a first clock signal for the first and second DACs and a second clock signal for the correction DAC, wherein a phase difference between the first and second clock signals is approximately 180 degrees.

* * * * *